(12) United States Patent
Reilly et al.

(10) Patent No.: US 9,748,093 B2
(45) Date of Patent: Aug. 29, 2017

(54) PULSED NITRIDE ENCAPSULATION

(71) Applicant: Applied Materials, Inc., Santa Clara, CA (US)

(72) Inventors: Patrick James Reilly, Pleasanton, CA (US); David Alan Bethke, Meridian, ID (US); Mihaela Balseanu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/071,523

(22) Filed: Mar. 16, 2016

(65) Prior Publication Data

US 2016/0284567 A1  Sep. 29, 2016

Related U.S. Application Data

(60) Provisional application No. 62/134,964, filed on Mar. 18, 2015.

(51) Int. Cl.
 *H01L 21/56* (2006.01)
 *H01L 21/02* (2006.01)
 *H01L 23/31* (2006.01)

(52) U.S. Cl.
 CPC .... *H01L 21/02315* (2013.01); *H01L 21/0217* (2013.01); *H01L 21/02274* (2013.01); *H01L 23/3171* (2013.01)

(58) Field of Classification Search
 CPC ........................................................ H01L 21/56
 USPC ......................................................... 438/127
 See application file for complete search history.

(56) References Cited

U.S. PATENT DOCUMENTS

| | | | |
|---|---|---|---|
| 4,877,641 A | 10/1989 | Dory | |
| 5,567,661 A | 10/1996 | Nishio et al. | |
| 6,835,663 B2 | 12/2004 | Lipinski | |
| 6,900,002 B1 | 5/2005 | Plat | |
| 7,079,740 B2 | 7/2006 | Vandroux et al. | |
| 7,125,758 B2 | 10/2006 | Choi et al. | |
| 7,501,355 B2 | 3/2009 | Bhatia et al. | |
| 7,638,440 B2 | 12/2009 | Wang et al. | |
| 7,754,294 B2 | 7/2010 | Choi et al. | |
| 7,785,672 B2 | 8/2010 | Choi et al. | |

(Continued)

FOREIGN PATENT DOCUMENTS

KR   10-2012-0024473 A   3/2012

*Primary Examiner* — Moazzam Hossain
*Assistant Examiner* — Omar Mojaddedi
(74) *Attorney, Agent, or Firm* — Kilpatrick Townsend & Stockton LLP

(57) ABSTRACT

Aspects of the disclosure pertain to methods of forming conformal liners on patterned substrates having high height-to-width aspect ratio gaps. Layers formed according to embodiments outlined herein have been found to inhibit diffusion and electrical leakage across the conformal liners. The liners may comprise nitrogen and be described as nitride layers according to embodiments. The conformal liners may comprise silicon and nitrogen and may consist of silicon and nitrogen in embodiments. Methods described herein may comprise introducing a silicon-containing precursor and a nitrogen-containing precursor into a substrate processing region and concurrently applying a pulsed plasma power capacitively to the substrate processing region to form the conformal layer.

9 Claims, 5 Drawing Sheets

(56) References Cited

U.S. PATENT DOCUMENTS

| | | |
|---|---|---|
| 7,790,635 B2 | 9/2010 | Balseanu et al. |
| 7,884,035 B2 | 2/2011 | Park et al. |
| 8,074,599 B2 | 12/2011 | Choi et al. |
| 8,083,853 B2 | 12/2011 | Choi et al. |
| 8,328,939 B2 | 12/2012 | Choi et al. |
| 8,536,065 B2 | 9/2013 | Seamons et al. |
| 8,993,454 B2 | 3/2015 | Seamons et al. |
| 2004/0000534 A1 | 1/2004 | Lipinski |
| 2005/0199013 A1 | 9/2005 | Vandroux et al. |
| 2005/0199585 A1 | 9/2005 | Wang et al. |
| 2005/0202683 A1 | 9/2005 | Wang et al. |
| 2006/0005771 A1 | 1/2006 | White et al. |
| 2006/0105106 A1 | 5/2006 | Balseanu et al. |
| 2006/0269693 A1 | 11/2006 | Balseanu et al. |
| 2007/0246831 A1* | 10/2007 | Gabric ............... H01L 21/7682 257/758 |
| 2008/0268175 A1 | 10/2008 | Park et al. |
| 2009/0075490 A1 | 3/2009 | Dussarrat |
| 2009/0255759 A1 | 10/2009 | Barnes |
| 2010/0099236 A1 | 4/2010 | Kwon et al. |
| 2010/0099271 A1* | 4/2010 | Hausmann ............ C23C 16/345 438/778 |
| 2010/0221925 A1* | 9/2010 | Lee ...................... C23C 16/045 438/792 |
| 2011/0095402 A1 | 4/2011 | Park et al. |
| 2011/0223774 A1 | 9/2011 | Kweskin et al. |
| 2011/0244142 A1 | 10/2011 | Cheng et al. |
| 2012/0080779 A1 | 4/2012 | Seamons et al. |
| 2013/0183835 A1 | 7/2013 | Nguyen et al. |
| 2013/0319329 A1 | 12/2013 | Li et al. |
| 2014/0017897 A1 | 1/2014 | Seamons et al. |
| 2014/0113457 A1* | 4/2014 | Sims ................ H01L 21/02167 438/792 |
| 2014/0370711 A1 | 12/2014 | Cheng et al. |
| 2015/0099375 A1* | 4/2015 | Haripin ............... H01L 21/0217 438/793 |
| 2015/0194317 A1 | 7/2015 | Manna et al. |
| 2016/0086794 A9 | 3/2016 | Cheng et al. |

* cited by examiner

PULSED NITRIDE ENCAPSULATION

CROSS-REFERENCES TO RELATED APPLICATIONS

This application claims the benefit of U.S. Prov. Pat. App. No. 62/134,964 filed Mar. 18, 2015, and titled "PULSED NITRIDE ENCAPSULATION" by Reilly et al., which is hereby incorporated herein in its entirety by reference for all purposes.

FIELD

The subject matter herein relates to forming conformal layers on patterned substrates.

BACKGROUND

Increasing the density of integrated circuits can increase speed and enable new applications. Many applications rely on the formation of gaps whose height-to-width aspect ratio increases with increasing density of the devices. The gaps are typically filled with a material appropriate for the specific application. The gapfill may be a conductor or a dielectric. In either case, a conformal liner may be needed prior to depositing the gapfill material. The conformal layer is intended to avoid undesirable diffusion or electrical leakage across the conformal liner either during manufacture or during the active life of the device. A high height-to-width aspect ratio gap makes applying a conformal liner difficult. The conformal liner should be uniform, relatively defect-free, and thin relative to the gap width.

Techniques which have been used to form conformal liners in gapfill applications are chemical-vapor deposition ("CVD") or plasma-enhanced CVD ("PECVD") techniques. CVD and PECVD methods may begin forming non-conformal liners and may deposit more material near the opening of a gap compared to down deep within the gap. Atomic Layer Deposition (ALD) may regain the desirable high conformality by alternating the exposure to precursors. However, the deposition rates typical for ALD are low and increase processing times.

Techniques are needed for forming very thin conformal liner layers for inhibiting diffusion and inhibiting electrical leakage while maintaining cost-effective deposition rates.

SUMMARY

Aspects of the disclosure pertain to methods of forming conformal liners on patterned substrates having high height-to-width aspect ratio gaps. Layers formed according to embodiments outlined herein have been found to inhibit diffusion and electrical leakage across the conformal liners. The liners may comprise nitrogen and be described as nitride layers according to embodiments. The conformal liners may comprise silicon and nitrogen and may consist of silicon and nitrogen in embodiments. Methods described herein may comprise introducing a silicon-containing precursor and a nitrogen-containing precursor into a substrate processing region and concurrently applying a pulsed plasma power capacitively to the substrate processing region to form the conformal layer.

Embodiments described herein include methods of forming a conformal silicon nitride layer on a patterned substrate. The methods include placing the patterned substrate in a substrate processing region of a substrate processing chamber. The methods further include flowing a silicon-containing precursor into the substrate processing region. The methods further include combining the silicon-containing precursor with a nitrogen-containing precursor. The methods further include forming a pulsed plasma by applying a square wave of RF power to the substrate processing region. The methods further include exciting the combination of the silicon-containing precursor and the nitrogen-containing precursor in the pulsed plasma. The methods further include forming the conformal silicon nitride layer. The conformal silicon nitride layer includes both silicon and nitrogen.

Combining the silicon-containing precursor and the nitrogen-containing precursor may occur in the substrate processing region. Combining the silicon-containing precursor and the nitrogen-containing precursor may occur prior to the substrate processing region and the combination of the silicon-containing precursor and the nitrogen-containing precursor flow into the substrate processing region together. The conformal silicon nitride layer may consist of silicon and nitrogen.

Embodiments described herein include methods of forming a conformal nitride layer in a gap on a patterned substrate. The methods include placing the patterned substrate in a substrate processing region of a substrate processing chamber. The methods further include flowing a precursor into the substrate processing region. The methods further include applying pulsed RF power to the substrate processing region to form a pulsed plasma from the precursor. The methods further include forming the conformal nitride layer. The conformal nitride layer includes nitrogen.

A duty cycle of the pulsed RF power may be between 80% and 99%. The conformal nitride layer may further include at least one of silicon, titanium and tantalum. The conformal nitride layer may have an atomic percentage of nitrogen less than 50%. The conformal nitride layer may be one of tantalum nitride, titanium nitride or silicon nitride. The pulsed RF power may be a square wave envelope about an RF frequency. The pulsed RF power may have a peak value and a minimum value and the minimum value is below 25% of the peak value.

Embodiments described herein include methods of forming a conformal hermetic layer in a gap on a patterned substrate. The methods include placing the patterned substrate in a substrate processing region of a substrate processing chamber. The methods further include flowing a precursor into the substrate processing region. The methods further include forming a pulsed plasma by applying pulsed RF power to the precursor within the substrate processing region. The methods further include forming the conformal hermetic layer.

The conformal hermetic layer may include nitrogen. A thickness of the conformal hermetic layer may be between 15 Å and 200 Å. A radio frequency of the pulsed RF power may be between 1,000 Hz and 50,000 Hz.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

Figure 1:
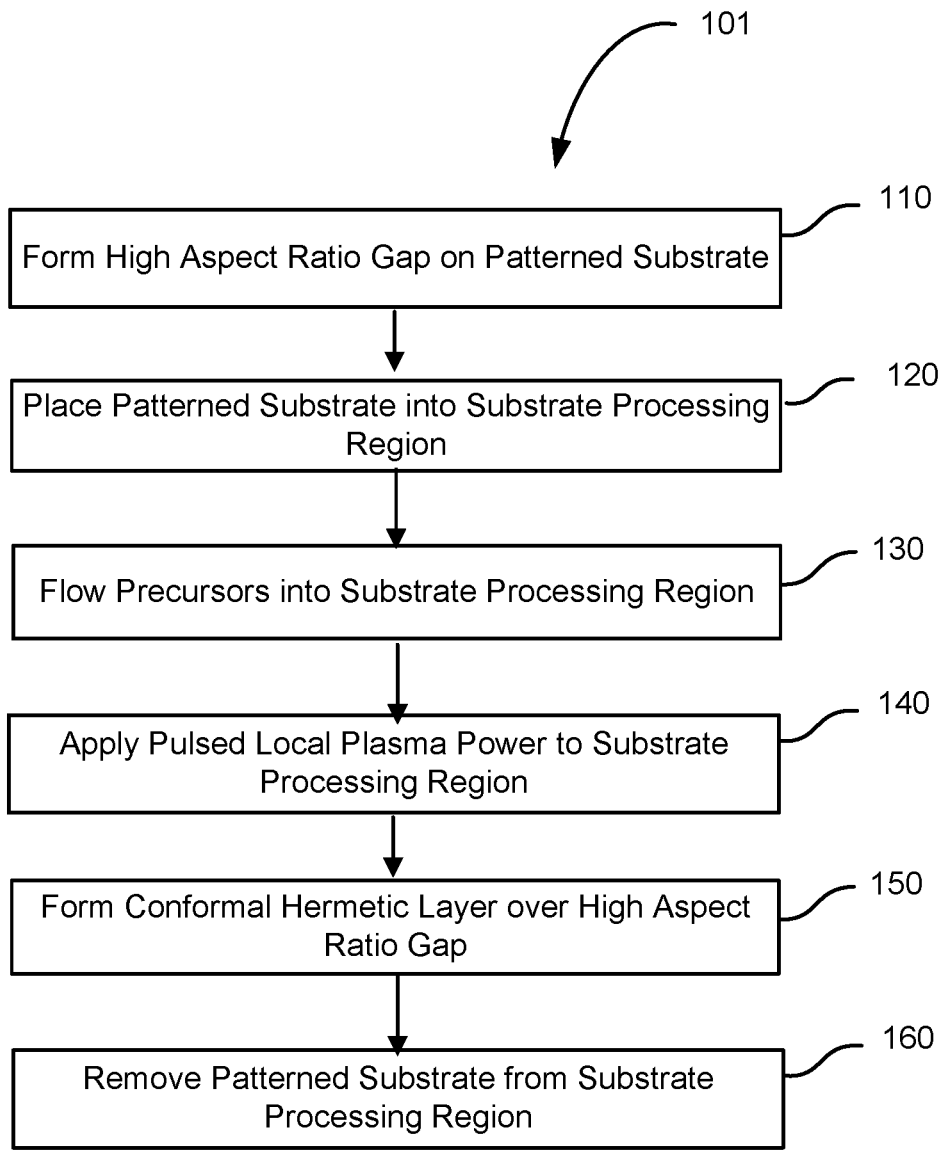
FIG. 1 is a flow chart of a film formation process of a conformal layer according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of the disclosure pertain to methods of forming conformal liners on patterned substrates having high height-to-width aspect ratio gaps. Layers formed according to embodiments outlined herein have been found to inhibit diffusion and electrical leakage across the conformal liners. The liners may comprise nitrogen and be described as nitride layers according to embodiments. The conformal liners may comprise silicon and nitrogen and may consist of silicon and nitrogen in embodiments. Methods described herein may comprise introducing a silicon-containing precursor and a nitrogen-containing precursor into a substrate processing region and concurrently applying a pulsed plasma power capacitively to the substrate processing region to form the conformal layer.

The conformal layers described herein may be formed on patterned substrate which have high height-to-width aspect ratio gaps including trenches and holes. The conformal layers may be nitride layers and may be silicon nitride layers or titanium nitride layers or tantalum nitride layers in embodiments. The conformal layers may consist of silicon and nitrogen, consist of tantalum and nitrogen or consist of titanium and nitrogen according to embodiments. The conformal layers may be hermetic and not allow measurable diffusion at operating temperatures. The conformal layers may not allow electrical leakage across the conformal layers. The conformal layers may be deposited using a local plasma which is pulsed or powered at multiple levels to improve conformality.

Pulsed plasmas as used herein appear to allow unreacted precursors to penetrate features on a patterned substrate at which point a subsequent pulse can promote a reaction which creates a uniform reaction along e.g. complex surface profiles. The uniform reaction creates a very conformal layer which still prevents chemical diffusion even when the conformal layer is very thin as described herein. The conformal layers have been found to exhibit very little electrical leakage or diffusion which may relate to the high conformality and/or the lack of pinholes or other defects in the extremely thin films. The conformal layers may be formed on silicon oxide or low-k dielectric layers, in embodiments, and protect the underlying layers from deleterious chemical reactions during later processing or during operation of the completed integrated circuit. Benefits of the embodiments include increased yield as a result of the decreased diffusion during manufacturing. Benefits of the embodiments include increased longevity of the resulting integrated circuits as a result of the decreased diffusion during the life of the integrated circuit. Benefits of the embodiments may also include increased performance of resulting integrated circuits as a result of the lack of the decreased diffusion and/or the decreased electrical leakage.

To facilitate the description of features including high height-to-width aspect ratio gaps and trenches, "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". "Depth" will be used to describe lengths in the vertical direction and "width" will be used to describe lengths parallel to the substrate plane. The methods described herein may avoid the problem of depositing more material near the top of a gap compared to deep within the trench. Such a drawback of traditional CVD may even result in pinching off the gap before a beneficial amount is even deposited at the bottom of the trench. A benefit of the present embodiments involve avoiding pinching off the deposition in such a manner. A further benefit of the embodiments described herein involve a more even deposition which allows a smaller net amount of liner material to be used to form a diffusion seal or hermetic seal. The reduction in amount of liner material needed increases the net amount of functional gapfill material which improves device performance.

To better understand and appreciate the embodiments described herein, reference is made to FIG. 1, which is a flowchart of a film formation process for forming a conformal layer 101 according to embodiments. The method begins by forming a high height-to-width aspect ratio gap on a patterned substrate (operation 110). The high vertical height-to-width ratio gap has a high height-to-width aspect ratio defined as the ratio of the height/depth into the patterned substrate to the narrowest dimension parallel to the plane of the patterned substrate. The vertical height-to-width aspect ratio may be more than 10:1, more than 20:1 or more than 30:1 in embodiments. The high vertical height-to-width aspect ratio gap may be called a trench if the gap also has a high length-to-width aspect ratio as described later. The width of the gap may be less than 25 nm, less than 22 nm or less than 17 nm according to embodiments. The height (aka depth) of the gap may be greater than 150 nm, greater than 250 nm or greater than 500 nm according to embodiments. The patterned substrate is placed in a substrate processing region of a substrate processing chamber in operation 120.

Figure 2:
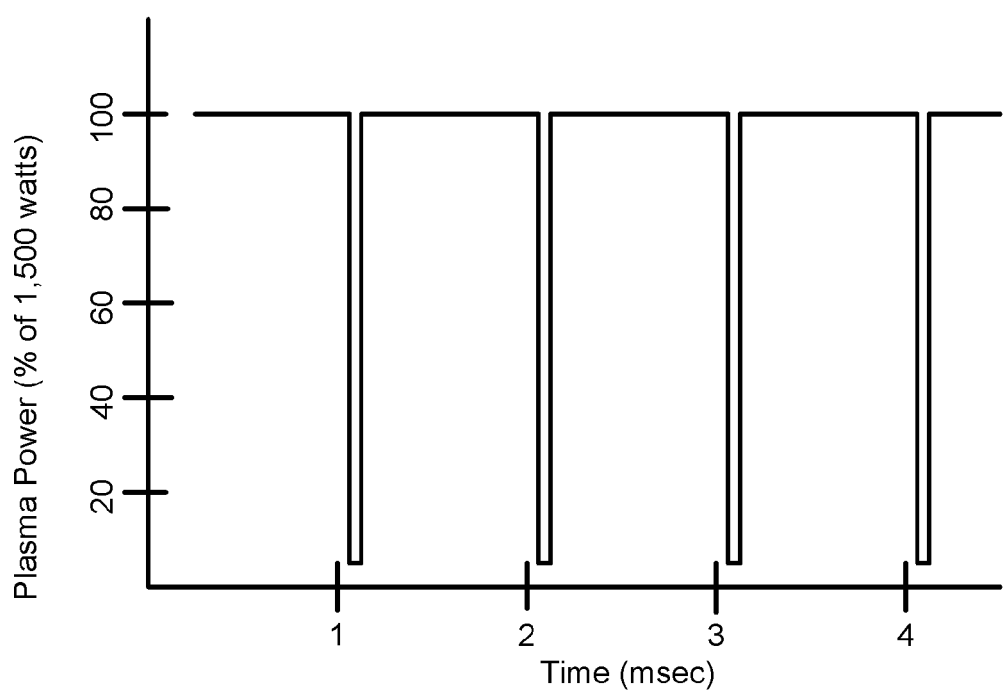
FIG. 2 is a plot of applied voltage to the plasma in the substrate processing region during formation of the conformal layer according to embodiments.

The patterned substrate is exposed to precursors in operation 130. The precursor(s) comprise nitrogen and may further comprise silicon in embodiments. A plasma is formed in the substrate processing region using parallel plates and the plasma is referred to as a capacitively-coupled plasma. An inductively-coupled plasma may be used according to embodiments. The plasma is formed by applying an RF frequency in a pulsed manner (operation 140) which will now be described. The RF plasma pulses may be in the form of a square-wave as shown in FIG. 2 according to embodiments. The precursor(s) flow without interruption into the substrate processing region during application of the RF plasma pulses.

The y-axis of FIG. 2 represents the percentage of the peak plasma power of the square-wave and the peak plasma power may be between 200 watts and 3,000 watts, between 500 watts and 2,500 watts, or between 1,000 watts and 2,000 watts in embodiments. The frequency of the square-wave (or "pulsing") may be between 0 Hz and 100,000 Hz, between 1,000 Hz and 50,000 Hz or between 5,000 Hz and 20,000 Hz according to embodiments. The duty cycle describes the percentage of time at or near the high power level during the square-wave. The duty cycle may be 80% and 99%, between 85% and 97% or between 90% and 95% in embodiments.

The graph shown in FIG. 2 indicates that the low plasma power level of the RF plasma pulses is not zero. Bringing the low plasma power level down all the way to or near zero has been found to cause process performance problems particularly an increase in particle detection count. The low plasma power level may not be zero in embodiments. The low plasma power level may be between 1% and 25%, between 2% and 20%, between 3% and 15% or between 4% and 10% of the peak plasma power according to embodiments. The low plasma power level may be below 25%, below 20%, below 15% or below 10% of the peak plasma power to ensure than 0% and near 0% are included in some embodiments. Lower low plasma power levels appear to improve deposition rate deep within trenches and especially holes and therefore correlate with higher conformality of the conformal hermetic layer.

A conformal hermetic layer is formed on the patterned substrate in operation 150. The conformal hermetic layer may fill the high height-to-width aspect ratio gap such that a thickness at or near the bottom of the high height-to-width aspect ratio gap may be within 25%, within 20% or within 15% of a thickness at or near the top of the high height-to-width aspect ratio gap. A thickness of the conformal hermetic layer may be between 15 Å and 200 Å, between 20 Å and 175 Å or between 25 Å and 150 Å according to embodiments. A deposition rate during formation of the conformal hermetic layer may be between 0.25 Å/second and 5 Å/second, between 0.5 Å/second and 3 Å/second, or between 0.75 Å/second and 2 Å/second in embodiments. The deposition rate may be significantly higher than deposition rates attainable using ALD while still offering much of the conformality and film quality benefits generally associated with ALD. The patterned substrate is removed from the substrate processing region in operation 160. The conformal hermetic layer may be devoid or essentially devoid of oxygen to improve the hermetic seal of the conformal hermetic layer and also to discourage diffusion of oxygen into adjacent layers. Oxygen-free layers are more difficult to make thin and conformal with high integrity than films that have oxygen. The conformal layers described herein address this need. The conformal layers described herein are oxygen-free yet still provide conformality, hermiticity and the ability to be applied as a very thin layer.

The composition of the conformal hermetic layer may be determined using a variety of techniques (such as X-ray photoelectron spectroscopy abbreviated XPS) and may be reported in atomic percentage of various elements. The atomic percentage of nitrogen in the conformal hermetic layer may be less than 50% or less than 49.5% in embodiments. A slightly lower concentration of nitrogen increases the ability of the conformal hermetic layer to inhibit diffusion. Silicon may also be present in the conformal hermetic layer and the atomic percentage of silicon may be greater than 50% or greater than 50.5% in embodiments.

During formation of the conformal layers described herein (e.g. operation 150 or operation 350 to be described shortly), a temperature of the patterned substrate may be between 100° C. and about 700° C., between 150° C. and 500° C. or between 200° C. and 300° C. according to embodiments. During formation, the pressure in the substrate processing region of the substrate processing chamber may be between 100 mTorr and 100 Torr, between 1 Torr and 20 Torr or between 2 Torr and 12 Torr. The pulsed plasma may be provided by pulsed RF power delivered to a showerhead electrode and a substrate support electrode of the chamber. The RF power may be provided at a frequency of between 100 kHz and 1 MHz, between 200 kHz and 750 kHz, between 300 kHz and 400 kHz, greater than 1 MHz, or between 13 and 14 MHz according to embodiments. The RF power may be provided at a mixed frequency including a first frequency between 100 kHz and 1 MHz, between 300 kHz and 400 kHz and a second frequency of between 1 MHz and 60 MHz or between 13 and 14 MHz.

Figure 3:
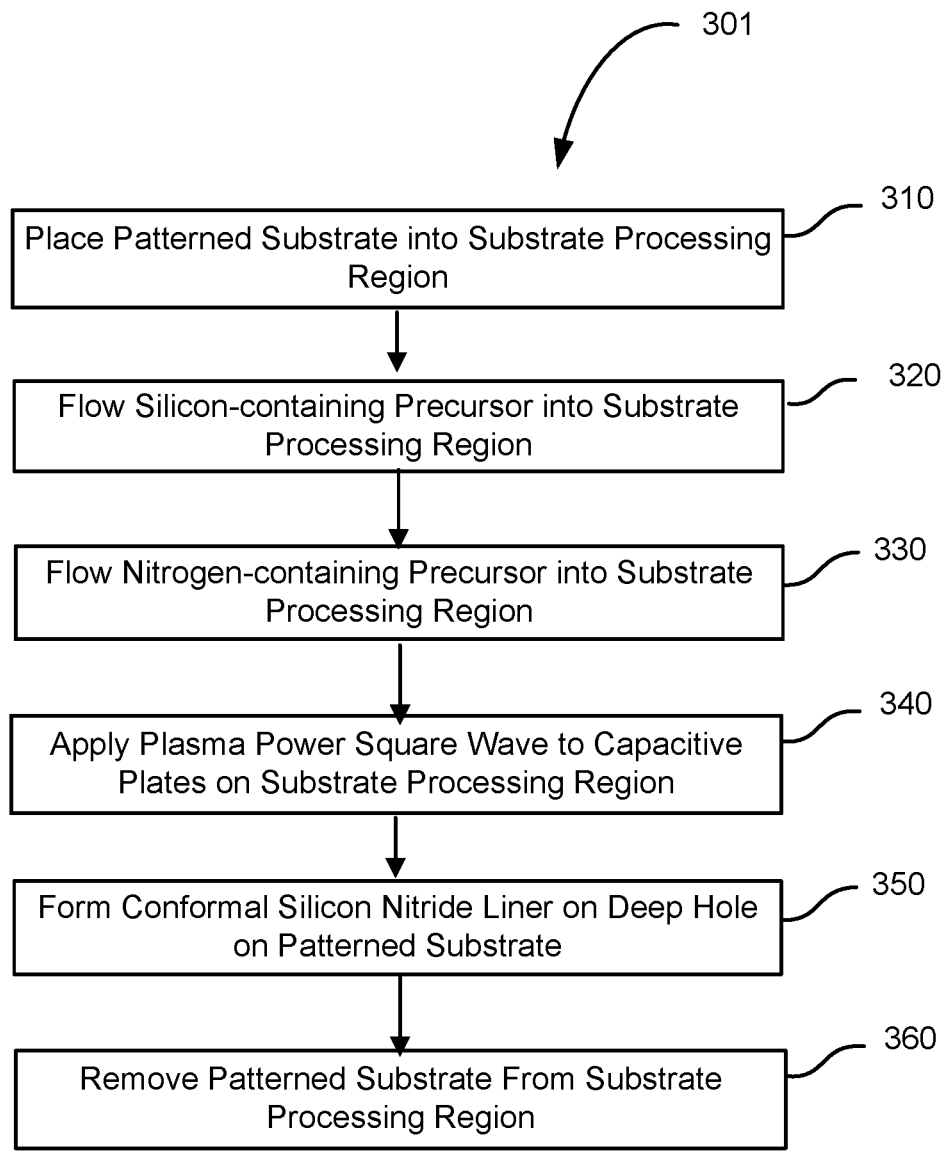
FIG. 3 is a flow chart of a film formation process of a conformal layer according to embodiments.

Reference is now made to FIG. 3, which is a flowchart of a film formation process for forming a conformal layer 301 according to embodiments. All chemicals, materials, process traits and parameters given herein apply to all embodiments presented herein, for example, the process parameters given previously may not be repeated during the discussion of FIG. 3. The method begins when a patterned substrate having a high height-to-width aspect ratio gap is placed in a substrate processing region of a substrate processing chamber in operation 310. A silicon-containing precursor is flowed into the substrate processing region in operation 320 and a nitrogen-containing precursor is flowed into the substrate processing region in operation 330. A plasma power square wave is applied capacitively to the substrate processing region in operation 340 to excite the combination of the silicon-containing precursor and the nitrogen-containing precursor. The patterned substrate is exposed to the plasma-excited precursors and a conformal silicon nitride liner is formed on the patterned substrate in operation 350. The conformal silicon nitride liner coats a deep hole substantially evenly on the patterned substrate. The patterned substrate is removed from the substrate processing region in operation 360.

The silicon-containing precursor may comprise $SiH_4$ or $Si_2H_6$ in embodiments. The nitrogen-containing precursor may comprise $NH_3$, $N_2H_4$ or $N_2H_2$ according to embodiments. Either or both precursors may be accompanied by or combined with inert gases to improve ease of striking a plasma or other plasma qualities. The inert gases may include He, Ar and/or $N_2$. The silicon-containing precursor may be flowed at between 20 sccm (standard cubic centimeter per minute) and 1 slm (standard liter per minute) between 50 sccm and 300 sccm or between 100 sccm and 200 sccm in embodiments. The nitrogen-containing precursor may be flowed at between 100 sccm and 1.5 slm. Helium may be flowed at between 1 slm and 10.0 slm and $N_2$ may be flowed at between 500 sccm and 5 slm. The flow rate of the silicon-containing precursor may be one eighth to one half of the flow rate of the nitrogen-containing precursor. The atomic flow rate of Si into the substrate processing region may be one eighth to one half of the atomic flow rate of N according to embodiments.

Figure 4:
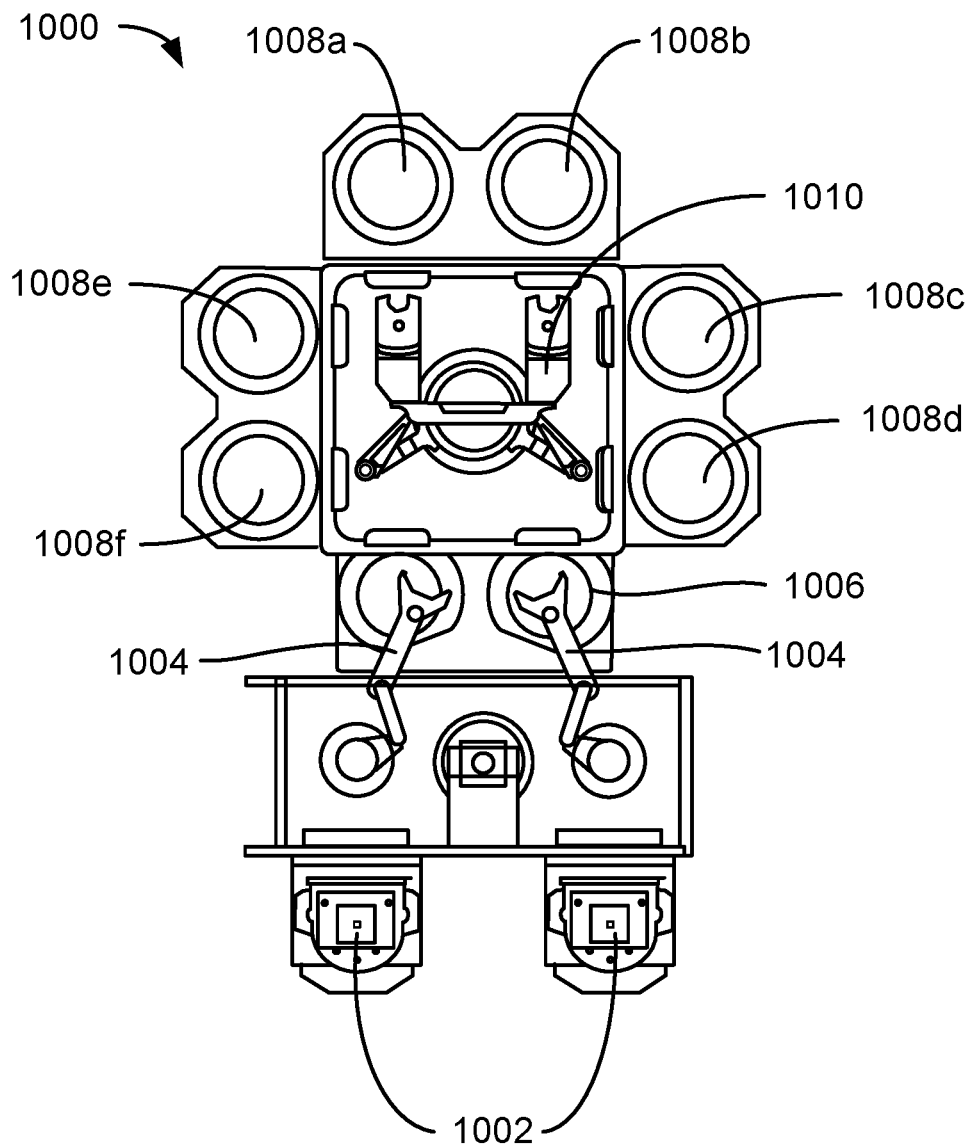
FIG. 4 shows a substrate processing system according to embodiments of the invention.
Figure 5:
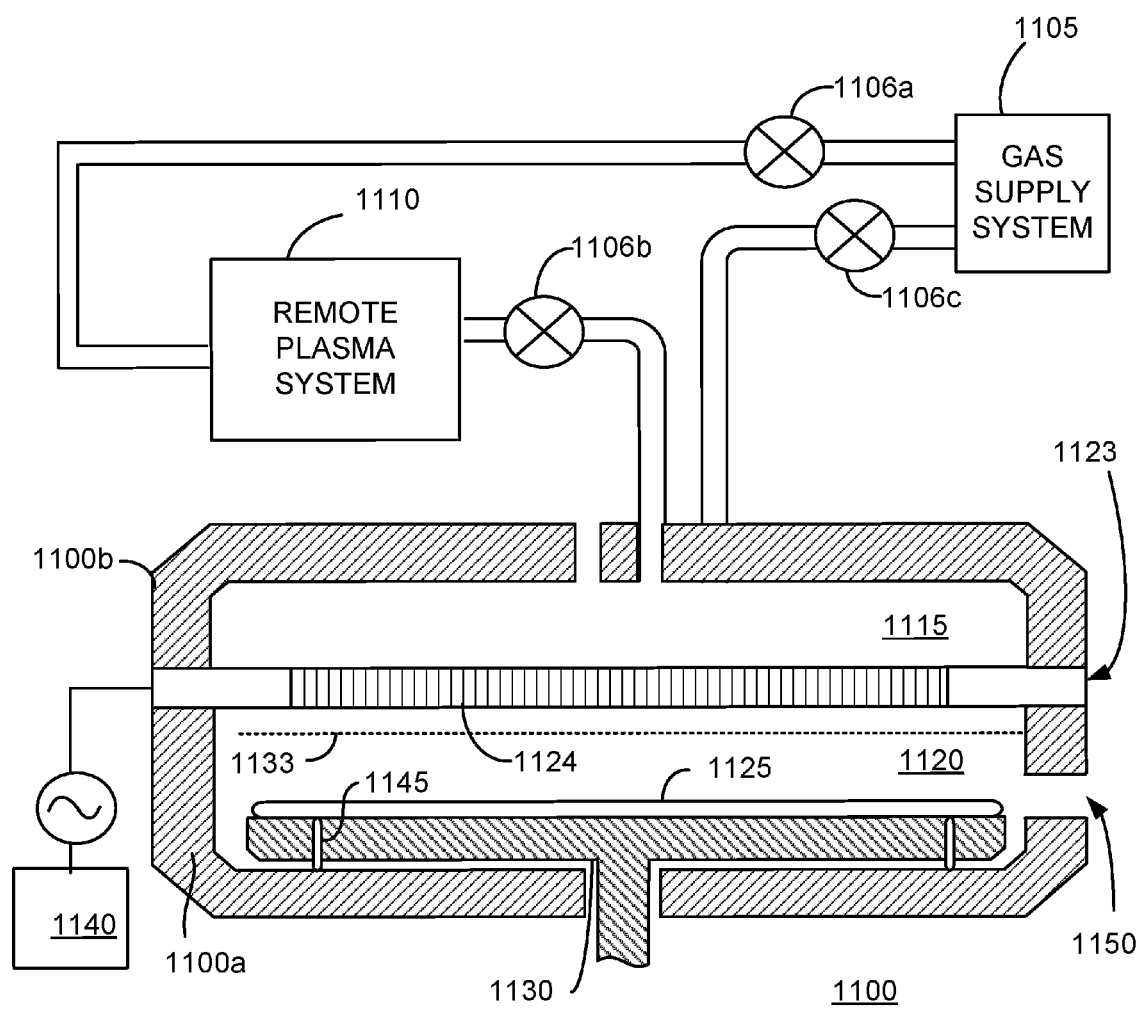
FIG. 5 shows a substrate processing chamber according to embodiments of the invention.

Embodiments of the methods described herein may be performed using substrate processing systems as shown in the example of FIG. 4 and using substrate processing chambers as shown in the example of FIG. 5. Substrate processing chambers may be incorporated into substrate processing systems for producing integrated circuit chips. FIG. 4 shows one such substrate processing system 1000 of deposition, baking and curing chambers according to disclosed embodiments. A pair of FOUPs (front opening unified pods) 1002 supply substrate substrates (e.g., 300 mm diameter wafers) that are received by robotic arms 1004 and placed into a low pressure holding area 1006 before being placed into one of the substrate processing chambers 1008a-f. A second robotic arm 1010 may be used to transport substrates from the holding area 1006 to the processing chambers 1008a-f and back.

The substrate processing chambers 1008a-f may include one or more system components for depositing, annealing, curing and/or etching a pulsed PECVD film on the substrate. In one configuration, two pairs of the processing chamber (e.g., 1008c-d and 1008e-f) may be used to deposit material on the substrate using a pulsed local plasma as described herein, and the third pair of processing chambers (e.g., 1008a-b) may be used to anneal the deposited material. In another configuration, the same two pairs of substrate processing chambers (e.g., 1008c-d and 1008e-f) may be configured to both deposit and anneal the material on the substrate, while the third pair of chambers (e.g., 1008a-b) may be used for UV or E-beam curing of the material. In still another configuration, all three pairs of chambers (e.g., 1008a-f) may be configured to deposit and treat the material on the substrate. Any one or more of the processes described may be carried out on chamber(s) separated from the fabrication system shown according to embodiments.

Referring now to FIG. 5, a vertical cross-sectional view of a substrate processing chamber 1100 is shown and includes a chamber body 1100a and a chamber lid 1100b. Substrate processing chamber 1100 contains a gas supply system 1105 which may provide several precursors through chamber lid 1100b into upper chamber region 1115. The precursors disperse within upper chamber region 1115 and may be evenly introduced into substrate processing region 1120 through blocker plate assembly 1123. During substrate processing, substrate processing region 1120 houses substrate 1125 which has been transferred onto substrate support pedestal 1130. Support pedestal 1130 may provide heat to substrate 1125 during processing to facilitate a deposition reaction.

The bottom surface of blocker plate assembly 1123 may be formed from an electrically conducting material in order to serve as an electrode for forming a capacitive plasma and may be used to form a pulsed plasma according to embodiments. During processing, the substrate (e.g. a semiconductor wafer) is positioned on a flat (or perhaps slightly convex) surface of the pedestal 1130. Substrate support pedestal 1130 can be moved controllably between a lower loading/off-loading position (depicted in FIG. 5) and an upper processing position (indicated by dashed line 1133). The separation between the dashed line and the bottom surface of blocker plate assembly 1123 is a parameter which helps control the plasma power density during processing. A lift mechanism and motor raises and lowers the support pedestal 1130 and its wafer lift pins 1145 as wafers are transferred into and out of substrate processing region 1120 by a robot blade (not shown) through an insertion/removal opening 1150 in the side of chamber body 1100a. The motor raises and lowers support pedestal 1130 between processing position 1133 and the lower wafer-loading position shown.

Before entering upper chamber region 1115, deposition and carrier gases are flowed from gas supply system 1105 through combined or separate delivery lines. The supply line for each process gas may include (i) safety shut-off valves 1106 that can be used to automatically or manually shut-off the flow a process gas into the chamber, and (ii) mass flow controllers (not shown) that may measure and control the flow of gas through the supply line. Some gases may flow through a remote plasma system (RPS) 1110 prior to entry into upper chamber region 1115.

After flowing into and through upper chamber region 1115, deposition and carrier gases are introduced into substrate processing region 1120 through through-holes in perforated circular gas distribution faceplate 1124 which forms the lower portion of blocker plate assembly 1123. Blocker plate assembly 1123 may also include a perforated blocker plate in order to increase the evenness of the distribution of precursors into substrate processing region 1120.

The deposition process performed in substrate processing chamber 1100 may be a plasma-enhanced process and may therefore be referred to as plasma-enhanced chemical vapor deposition (PECVD). In a plasma-enhanced process, an RF power supply 1140 may apply electrical power between gas distribution faceplate 1124 and support pedestal 1130 to excite the process gas mixture to form a plasma within the cylindrical region between gas distribution faceplate 1124 and substrate 1125 supported by support pedestal 1130. Gas distribution faceplate 1124 may have a conducting surface and/or may have a metal insert. In FIG. 5, the metal portion of gas distribution faceplate 1124 is electrically isolated from the rest of substrate processing chamber 1100 via dielectric inserts. This electrical isolation enables the voltage of faceplate 1124 to be varied with respect to, especially, support pedestal 1130 to apply the plasma power.

Flowing precursors into upper chamber region 1115 and subsequently into substrate processing region 1120 in conjunction with applying pulsed RF power between faceplate 1124 and support pedestal 1130 creates a plasma between faceplate 1124 and substrate 1125. The plasma produces plasma effluents which react to deposit a desired film on the surface of the semiconductor wafer supported on pedestal 1130. RF power supply 1140 may be a mixed frequency RF power supply that typically supplies power at a high RF frequency (RF1) of 13.56 MHz and a low RF frequency (RF2) of 360 kHz to enhance the decomposition of reactive species introduced into substrate processing region 1120. The desired film is then deposited on the surface of the semiconductor wafer supported on support pedestal 1130. Support pedestal 1130 may be resistively heated to provide thermal energy to substrate 1125 to assist with the reaction.

During a pulsed plasma-enhanced deposition process, the pulsed plasma may heat up process chamber 1100, including the walls of the chamber body 1100a surrounding an exhaust passageway (not shown) used to exhaust gases from substrate processing chamber 1100. When the plasma is off, a hot fluid may be circulated through the walls of substrate processing chamber 1100 to maintain the chamber at an elevated temperature. Preheating the walls of the substrate processing chamber 1100 to approximately the temperature during pulsed plasma processing may allow films to begin near their steady-state deposition rate, density, porosity and other film properties. Channels (not shown) may be provided within the chamber walls of substrate processing chamber 1100 for the hot fluid flow. Fluids used to heat the chamber body 1100a and possibly chamber lid 1100b may include water-based ethylene glycol or oil-based thermal transfer fluids in embodiments. Chamber heating can reduce condensation of reactant products which otherwise might migrate back into the processing chamber and adversely affect a deposition in process or a subsequent deposition. The remainder of the gas mixture that is not deposited in a layer, including reaction byproducts, is evacuated from substrate processing chamber 1100 by a vacuum pump through an orifice (not shown) in chamber body 1100a.

Support pedestal 1130 may be made of aluminum, anodized aluminum, ceramic, or a combination in embodiments. The wafer support platter of support pedestal 1130 may be resistively heated using an embedded single-loop embedded heater element configured to make multiple turns in the form of parallel concentric circles. An outer portion of the heater element may run adjacent to a perimeter of the support platter, while an inner portion may run along a path of a concentric circle having a smaller radius. The wiring to the heater element may pass through the stem of support pedestal 1100. Some, any or all of the chamber lining, gas inlet manifold faceplate, and various other reactor hardware are made out of material such as aluminum, anodized aluminum, or ceramic.

A remote plasma system 1110 may be mounted on chamber lid 1100b of substrate processing chamber 1100. Remote plasma system 1110 may be mounted on chamber lid 1100b. The plasma may dissociate a process gas including a fluorine-containing gas such as $NF_3$ and a carrier gas such as argon to generate free fluorine which is used to clean film deposits in substrate processing chamber 1100 such as interior surfaces during preventative maintenance procedures.

The substrate processing system is controlled by a system controller. In an exemplary embodiment, the system controller includes storage media and processors (e.g. general purpose microprocessors or application specific IC's). The processors may be processor cores present on a monolithic integrated circuit, separated but still located on a single-board computer (SBC) or located on separate printed circuit cards possibly located at different locations about the substrate processing system. The processors communicate with one another as well as with analog and digital input/output boards, interface boards and stepper motor controller boards using standard communication protocols. The system controller controls all of the activities of the CVD machine. The system controller executes system control software, which is a computer program stored in a computer-readable medium. The computer program includes sets of instructions that dictate the timing, mixture of gases, chamber pressure, chamber and substrate temperatures, RF power levels, support pedestal position, and other parameters of a particular process.

In the preceding description, for the purposes of explanation, numerous details have been set forth to provide an understanding of embodiments of the subject matter described herein. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. "Silicon" or "polysilicon" of the patterned substrate is predominantly Si but may include minority concentrations of other elemental constituents such as nitrogen, oxygen, hydrogen and carbon. "Silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Silicon nitride" may consist essentially of or consist of silicon and nitrogen. "Silicon oxide" of the patterned substrate is predominantly $SiO_2$ but may include minority concentrations of other elemental constituents such as nitrogen, hydrogen and carbon. In embodiments, silicon oxide films consist essentially of or consist of silicon and oxygen. Analogous definitions will be understood for other elements or compounds.

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "gap" is used with no implication that the feature of the patterned substrate has a large length-to-width aspect ratio. Viewed from above the surface, gaps may appear circular, oval, polygonal, rectangular, or a variety of other shapes. The term "gap" refers to a "trench" or a "hole". A length-to-width aspect ratio of the hole may be about 1:1, as viewed from above, whereas a length-to-width aspect ratio of the trench may be greater than 10:1. The methods described herein are particularly well-suited at forming a conformal liner layer on large height-to-width aspect ratio holes which are more difficult to uniformly line compared to trenches. A trench may be in the shape of a moat around an island of material in which case the length-to-width aspect ratio would be the circumference divided by the width of the gap averaged around the circumference. The term "hole" is used to refer to a low length-to-width aspect ratio trench which may or may not be filled with material to form an interconnect or DRAM cell. As used herein, a conformal film formation process refers to a generally uniform accumulation of material on a surface in the same shape as the surface, i.e., the surface of the formed layer and the pre-formation surface are generally parallel. A person having ordinary skill in the art will recognize that the interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a conformal silicon nitride layer on a patterned substrate, the method comprising:
    placing the patterned substrate in a substrate processing region of a substrate processing chamber;
    flowing a silicon-containing precursor into the substrate processing region;
    combining the silicon-containing precursor with a nitrogen-containing precursor;
    forming a pulsed plasma by applying a square wave of RF power to the substrate processing region, wherein the square wave comprises a minimum plasma power level between 1% and 25% of the peak plasma power and wherein the square wave has a duty cycle between 80% and 99%;
    exciting the combination of the silicon-containing precursor and the nitrogen-containing precursor in the pulsed plasma; and
    forming the conformal silicon nitride layer, wherein the conformal silicon nitride layer comprises both silicon and nitrogen, and wherein an atomic percentage of nitrogen in the conformal silicon nitride layer is less than 50% while an atomic percentage of silicon is greater than 50% in the conformal silicon nitride layer.

2. The method of claim 1 wherein combining the silicon-containing precursor and the nitrogen-containing precursor occurs in the substrate processing region.

3. The method of claim 1 wherein combining the silicon-containing precursor and the nitrogen-containing precursor occurs prior to the substrate processing region and the combination of the silicon-containing precursor and the nitrogen-containing precursor flow into the substrate processing region together.

4. The method of claim 1 wherein the conformal silicon nitride layer consists of silicon and nitrogen.

5. A method of forming a conformal silicon nitride layer in a gap on a patterned substrate, the method comprising:
    placing the patterned substrate in a substrate processing region of a substrate processing chamber;
    flowing a precursor into the substrate processing region;
    applying pulsed RF power in the form of a square wave to the substrate processing region to form a pulsed plasma from the precursor, wherein the pulsed RF power comprises a minimum plasma power level between 2% and 20% of the peak plasma power, wherein the square wave has a duty cycle between 85% and 97%; and
    forming the conformal silicon nitride layer, wherein the conformal silicon nitride layer comprises silicon and nitrogen, and wherein an atomic percentage of nitrogen in the conformal silicon nitride layer is less than 50% while an atomic percentage of silicon is greater than 50% in the conformal silicon nitride layer.

6. A method of forming a conformal hermetic layer in a gap on a patterned substrate, the method comprising:
    placing the patterned substrate in a substrate processing region of a substrate processing chamber;
    flowing a precursor into the substrate processing region;
    forming a pulsed plasma by applying pulsed RF power in the form of a square wave to the precursor within the substrate processing region, wherein the pulsed RF power comprises a minimum plasma power level between 1% and 25% of the peak plasma power, wherein the square wave has a duty cycle between 80% and 99%; and
    forming the conformal hermetic layer.

7. The method of claim 6 wherein the conformal hermetic layer comprises nitrogen.

8. The method of claim 6 wherein a thickness of the conformal hermetic layer is between 15 Å and 200 Å.

9. The method of claim 6 wherein a radio frequency of the pulsed RF power is between 1,000 Hz and 50,000 Hz.

* * * * *